United States Patent [19]
Brox et al.

[11] Patent Number: 5,881,013
[45] Date of Patent: Mar. 9, 1999

[54] APPARATUS FOR CONTROLLING CIRCUIT RESPONSE DURING POWER-UP

[75] Inventors: Martin Brox; Franz Freimuth, both of Munich, Germany; Mike Killian, Richmond, Vt.; Naokazu Miyawaki, Yokohama, Japan; Thilo Schaffroth, Roehrmoos, Germany

[73] Assignees: Siemens Aktiengesellschaft, Munich, Germany; Kabushiki Kaisha Toshiba, Kanagawa-Ken, Japan

[21] Appl. No.: 884,081

[22] Filed: Jun. 27, 1997

[51] Int. Cl.$^6$ .................................................. G11C 5/14
[52] U.S. Cl. .......................... 365/226; 365/228; 365/193; 365/189.08; 327/143; 327/291; 327/172; 327/176
[58] Field of Search .................................. 365/226, 228, 365/193, 189.08; 327/143, 198, 291, 172, 173, 174, 176

[56] References Cited

U.S. PATENT DOCUMENTS 5,414,380  5/1995  Floyd et al. ............................ 327/198
5,786,719  7/1998  Furutani ................................. 327/202

*Primary Examiner*—David Nelms
*Assistant Examiner*—Andrew Q. Tran
*Attorney, Agent, or Firm*—Stanton C. Braden

[57] ABSTRACT

A circuit embodying the invention includes a gating circuit responsive to a first control signal and to a second externally supplied control signal having an active state and an inactive state. The first control signal is produced by a power supply circuit which is responsive to the application of an externally supplied operating voltage for producing an "internal" operating voltage and which produces the first control signal having an active state when the internal operating voltage reaches a predetermined value. The gating circuit has an output for producing a third control signal which is enabling only if the second control signal goes from its inactive state to its active state when the first control signal is already in, and remains in, its active state. The gating circuit prevents a chip from operating in an unintended mode at power-up.

1 Claim, 3 Drawing Sheets

APPARATUS FOR CONTROLLING CIRCUIT RESPONSE DURING POWER-UP

FIELD OF INVENTION

This invention relates controlling integrated circuits (ICs) or chips, such as memory chips, during power-up.

BACKGROUND OF INVENTION

Power-up refers to when power is applied to initialize the chip for operation. Initialization sets the chip's internal signals at the initial logic levels. Logic levels include logic low or 0 and logic high or 1. Generally 0 corresponds to zero volts and 1 corresponds to VDD, which is the chip's operating voltage.

In general, an IC includes different modes of operation, such as normal and test, or performs various functions. The various chip modes or functions are controlled by one or more external control signals. Activation of one or more of these control signals causes the chip to operate in certain operating modes or perform specified functions. These external control signals or system level signals are generated by other ICs within the system. Typically, certain external control signals of the chip are active low signals.

The fact that certain external control signals are active low can be problematic. For example, at least at the system level, various ICs power-up at different times. As the chip is powered-up, the chip's internal signals are initialized and set at their designated levels. A chip ready signal is issued to signify that the chip has been initialized and ready for operation. Typically, the chip ready signal is issued when the operating voltages that are supplied to the various sub-circuits of the IC reach a predetermined level.

However, different chips within the system take different amount of time to power-up. As such, there may be occasions when one (first) chip issues a chip ready signal before another (second) chip. If, for example, the second chip is the chip that generates the external control signals for the first chip, a problem arises. Since certain control signals on the first chip are active low, incomplete initialization of the second chip results in the external control signal of the first chip to be in an active and unintended state. Depending on which control signals are affected, the IC can be caused to enter into, for example, test mode unintentionally. As will be appreciated by those skilled in the art, this result is undesirable as a user may think that the chip is operating in normal mode.

Conventionally, to ensure that the IC is operating in the intended or normal mode, the control signals are cycled several additional times before the IC is accessed for normal operation. To illustrate the problem discussed above, a description of how such a problem may be encountered in a conventional dynamic random access memory (DRAM) IC is provided.

In the discussion to follow, including the detailed description of the invention, a postscript "n" or "p" may be appended to a control signal or its acronym. The "n" indicates that the signal is active when it is "low" (i.e., active low) and the "p" indicates that the signal is active when it is "high" (i.e., active high).

FIG. 1 shows a DRAM chip 7 and a memory controller 9 of, for example, a computer system. During system power-up, the operating voltages $V_{DD}$ and ground (GND) are supplied to various circuits including the controller and the memory chip. A boost pump 60 in the chips receives $V_{DD}$ and GND and generates a "boosted" voltage Vpp in response. Vpp, which generally has an amplitude greater than $V_{DD}$, is distributed to various sub-circuits within the chip. Additionally, boost pump 60 provides a CHRDYp signal. When the Vpp reaches a desired level, boost pump generates an active CHRDYp signal, indicating that the respective chip is ready for operation.

The memory chip and controller communicate via RASn, CASn, and WEn signals. The signals originate at the controller and are passed to the memory chip, serving as external control signals to dictate memory chip functions. In particular, the RASn is the external master control signal of the memory chip. As such, the RASn needs to be active to initiate an operation. For example, a regular memory access cycle is initiated by RASn going low with row addresses being active. CASn then goes low with column addresses being activated. Depending on whether WEn is high or low, the access is either a read or write access.

A RAS interface 50 receives RASn and CHRDYp signals as inputs and provides an output RAS internal (RINTp) signal. The RINTp is an internal signal used to control various subcircuits, along with CAS and WEn. As shown, RINTp is active when both CHRDYp and RASn are active.

The memory chip also includes different modes of operation, such as normal and test. The test mode enables user to test the memory chip. In test mode, memory accesses such as reads and writes behave differently than in normal mode. A test mode decoder 80 is provided to control the chip's operating mode. The test mode decoder receives RINTp, CASn, and WEn signals and generates an output signal TMp. An active TMp signal causes the memory chip to operate in test mode. As RINTp is derived from RASn, it effectively plays a role in determining the chip's mode of operation.

In conventional DRAMs, a problem arises during power-up. If RASn, CASn, and WEn signals are active when CHRDYp becomes active, the memory chip enters test mode. Since RASn, CASn, and WEn are active low signals, this scenario can easily occur. For example, if the controller takes longer to initialize than the memory chip, than RASn, CASn, WEn would be low when CHRDYp is active because the controller has not completely powered up yet. This scenario causes the memory chip to enter test mode unintentionally, resulting in the chip to operate differently.

From the above discussion, it is therefore desirable to prevent an IC from inadvertently entering into an unintended mode of operation during power-up.

SUMMARY OF THE INVENTION

A circuit embodying the invention includes a power supply circuit which is responsive to the application of an externally supplied operating voltage for producing an internal operating voltage and a first control voltage indicative of the state of the internal operating voltage. When the internal operating voltage reaches a predetermined value the first control signal goes from an inactive state to an active state. The first control signal and a second, externally supplied, control signal, having an active state and an inactive state, are supplied to a gating circuit responsive to the first and second control signals. The gating circuit produces a third (internal) control signal which goes to an active state only if the second control signal is in an inactive state while the first control signal is in an active state and the second control signal subsequently makes a transition from its inactive state to its active state while the first control signal is still in its active state.

In one embodiment of the invention the power supply circuit and the gating circuit are part of a memory circuit which includes an array of memory cells arranged in rows and columns and a row decoder for selectively energizing rows of the memory array. The decoder includes input means adapted to receive address signals, to be decoded, for selecting particular rows of the memory array. The third control signal is used to control the operability of the row decoder whereby the row decoder is enabled only when the third control signal is in its active state.

The embodiment of the invention may also include precharging circuitry, coupled to the row decoder circuit, which is responsive to the third control signal being in an inactive state for precharging the row decoder and its outputs to a de-energized condition.

In a memory circuit embodying the invention, an externally supplied row address strobe signal (RASn) is supplied to a control circuit to which is also applied a chip ready (CHRDYp) signal. The CHRDYp signal goes active when the internal voltage developed to operate the memory circuit reaches an operable level. The control circuit produces an output signal, defined as an internal row address strobe (RINTp) signal, which is used to control the row decoders which drive the rows of the memory array. The RINTP signal goes active only if the RASn signal is inactive while the CHRDYp signal is active and the RASn signal then goes from its inactive to its active state while CHRDYp is still active. This ensures that the chip does not operate in an unintended mode at power-up.

BRIEF DESCRIPTION OF THE DRAWINGS

In the accompanying figures like reference characters denote like components.

DETAILED DESCRIPTION OF THE INVENTION

The invention relates to a control circuit that controls the response of integrated circuit (IC) during power-up. To facilitate discussion of the invention, the invention is described in the context of a memory IC or chip such as random access memories (RAMs) including dynamic RAMs (DRAMs) static RAMs (SRAMs) synchronous DRAMs (SDRAMs). However, the invention is applicable to ICs in general.

Figure 2:
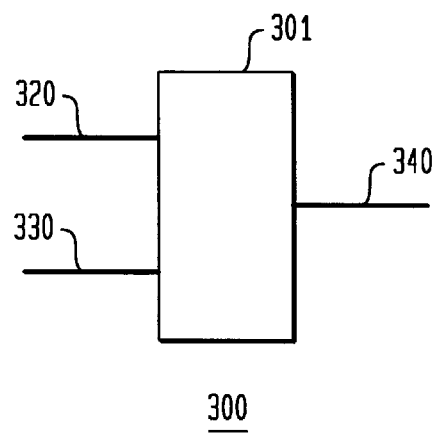
FIG. 2 is a block diagram of a control circuit in accordance with the invention.

Referring to FIG. 2, a control circuit in accordance with the invention is shown. The control circuit is used in controlling the power-up of a chip to produce the desired response. As shown, the control circuit comprises logic circuitry that generates an output 340 in response to internal and external signals 320 and 330. The internal signal is, for example, the signal that signifies that the chip is powered up. The external signal, which is a control signal, indicates an access to the chip. Additionally, the external signal is a signal used to determine the IC's mode of operation. The output 340 is, for example, an internal control signal that, when active, invokes chip operation.

The control circuit inhibits the IC from entering into an unintended mode of operation during power-up. In one embodiment, when the external input signal is already active or is active at about the same time as when the internal signal becomes active, the control circuit ignores the external signal until the next time that the external signal is active after being inactive. In effect, the control circuit in this case acts as if the external control signal is inactive even though it is active.

Accordingly, the control circuit inhibits output 340 from becoming active if the external signal is active when the internal input signal 320 becomes active. The output switches to the active state after the external signal transitions to the inactive state and then back to the active state. As a result, switching the output signal to its active state is delayed for one external control signal cycle if the internal signal 320 is active at or after the external control signal 330 becomes active. This ensures that the IC generating the external control signal is powered up and ready for operation at the time that the IC receiving the signal is ready for operation, thus preventing it from entering into an unintended mode of operation. On the other hand, if the internal signal is already active when the external control signal becomes active, the output 340 switches to an active state without waiting. In this case, there is no need to wait for the next external control signal cycle since the IC generating the external control signal is powered up and ready.

Figure 1:
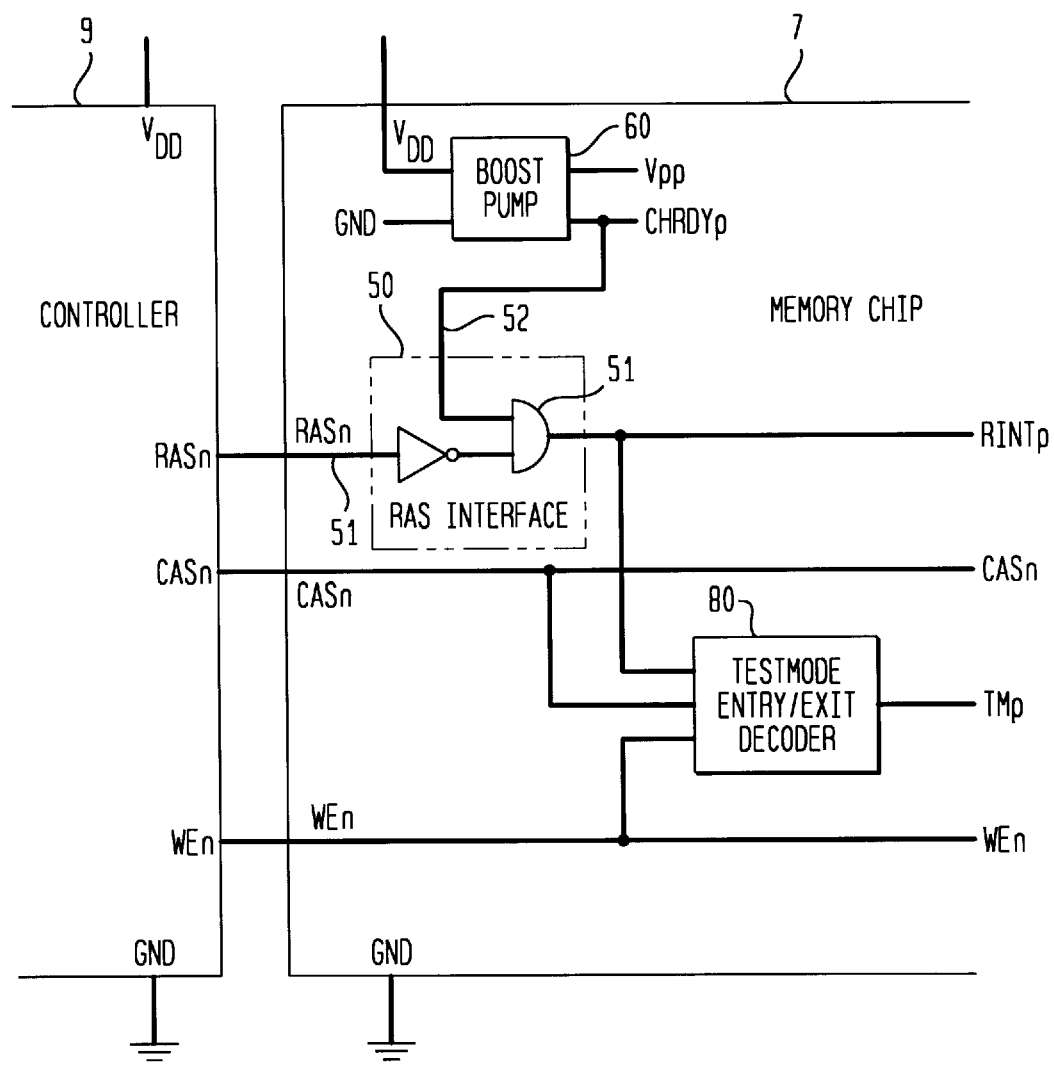
FIG. 1 is a block diagram of a portion of a prior art memory system.

In another embodiment, the control circuit 300, for example, replaces the RAS interface of a memory chip, such as that shown in FIG. 1. When used as a RAS interface, the internal signal 320 is a power-up or chip ready (CHRDYP) signal and the external control signal 330 is a row address strobe (RASn). The output generated in response to the CHRDYp and RASn signal serves as the RINTp signal. As a result, the control circuit prevents the chip from operating in an unintended mode by ensuring that the RINTp is active prior to being deactivated by active CHRDYp and RASn.

Figure 3:
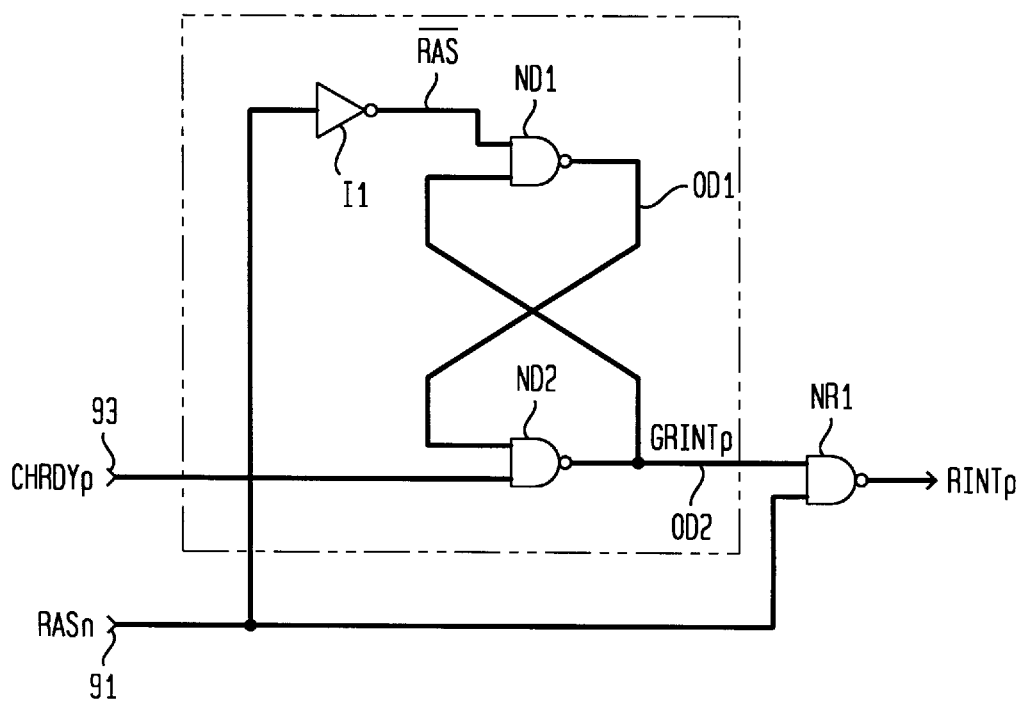
FIG. 3 is a schematic diagram of a control circuit embodying the invention.

Referring to FIG. 3, an exemplary control circuit 300 is shown. The control circuit is employed in, for example, a memory chip such as a DRAM, SDRAM, or SRAM. The circuit includes an input terminal 91 to which is applied an "external" row address strobe input signal (RASn) and an input terminal 93 to which is applied a Chip Ready (p) signal, also identified as CHRDYp. The CHRDYp signal is an active high signal (i.e., when it is active it is in a high state or at a high level). CHRDYp goes active during power-up when the internal voltages (e.g., Vpp in boost pump 60 of FIG. 1) have reached levels which are of sufficient amplitude to ensure reliable circuit operation. When the internal voltages are of insufficient amplitude, the CHRDYp remains in its inactive state (low). The "externally" supplied row address strobe signal, also denoted as RASn, is an active low signal (i.e., when it is active it is in a low state or at a low level). It is the master control signal. In circuits embodying the invention, RASn is gated to produce an internal RAS signal also referred to as RINTp which is an active high signal and which is used internally to the chip.

As shown in FIG. 3, an inverter I1 inverts the RASn signal. In applications where the external control signal is active high, the inverter may be eliminated. A flip-flop (FF) receives the inverted RASn and the CHRDYp signals. The flip-flop illustratively is a set-reset (R-S) type of FF. The R-S FF comprises first and second NAND gates ND1 and ND2. One input of NAND gate ND1 and one input of NAND gate ND2 are respectively designated as S and R terminals of the R-S FF. The output of inverter I1 is input into S terminal and the CHRDY signal is applied to the R terminal. The output OD1 of ND1 is connected (and fed back) to the second input of ND2 and the output OD2 of ND2 is connected (and fed back) to the second input of ND1. So connected, ND1 and ND2 are cross-coupled to form a set-reset flip-flop.

The output OD2 of ND2, which is the output of the FF, is designated as the GATE RAS INTERNAL (GRINTp) signal. The GRINTp signal is applied to a second input of a two-input NOR gate NR1. RASn is applied to the one input of NOR gate NR1. The output of NR1, which is the output of the control circuit, is the internal RINTp signal. As discussed below, RINTp is produced in response to a RASn signal subject to the controlling or gating of the GRINTp signal. RINTp is then distributed to various circuits of chip 7 to allow certain chip operations to take place.

In sharp contrast to the way RINTp is generated in the prior art systems, RINTP goes active only if RASn is inactive when CHRDYp becomes active. If RASn is active when CHRDYp becomes active, RINTp remains inactive until RASn transitions to an inactive state and then back to an active state. This ensures that the memory chip does not enter into an unintended mode of operation.

The control circuit uses the CHRDYp signal to generate a gating (control) signal denoted as GRINTp which may be used to inactivate RINTp. When the CHRDYp signal is inactive (i.e., low), the output of ND2, which is the GRINTp signal, is in a "high" state regardless of the state of the RASn signal. When GRINTp is "high", a high signal is applied to an input of NR1. This causes the output of NR1, which defines the signal RINTp, to be held, or driven, to a low level which places RINTp in its inactivate state. Therefore, so long as the CHRDYp signal is inactive (in its low state), RINTp also remains inactive.

As illustrated, RINTp can only go active after the signal CHRDYp becomes active (i.e., goes high). Furthermore, the activation of RINTp is made to depend on the condition or state of the RASn signal when CHRDY goes active.

When CHRDYp goes active (its high state) during power-up, the external RASn signal may be either:

(a) active (i.e., in its low state) defined as Case 1; or
(b) inactive (i.e., in its high state) defined as Case 2.

Case 1

If RASn is active (low) when CHRDYp goes active during power-up, RINTP is rendered inactive (held low or driven low) by a gated signal (GRINTp) derived from the CHRDYp signal. RINTp will remain inactive until RASn goes from the active state to the inactive state and then makes a transition from its inactive (i.e., high) state to its active (i.e., low) state. When RASn goes to an active state (i.e., low), after having been inactive, and CHRDYp is still high (active), RINTp will be rendered active. When RINTp is driven to its active (high) state, it initiates the first DRAM cycle.

The response of the control circuit for the conditions of RAS being active (low) when the signal CHRDYp goes active (i.e., high) is now examined. When the CHRDYp signal goes active (i.e., from "low" to "high"), its previously low state had caused the output OD2 of ND2 to be high. When CHRDYp goes high, the output of ND2 remains high. For RASn being low, and CHRDYp going from low to high, the two inputs to ND1 are high, whereby its output OD1 remains low. The low at OD1 applied to the input of ND2 causes the output GRINTp of ND2 to remain in a high state causing RINTp to remain in its low (inactive) state.

When RASn subsequently goes to its inactivate state (i.e., high), the output of I1 (which is the inverse of RASn) goes low causing the output OD1 of ND1 to go high. OD1 is applied to one input of ND2 and CHRDYP is applied to the other input of ND2. The two inputs to ND2 are now high and its output GRINTp is driven low. This low is fed back to one input of ND1 ensuring that the output of ND1 remains high. However, since RASn is high and is applied to one input of NR1, the output of NR1 remains low whereby RINTp remains in its low (or deactivated state). Subsequently, when the RASn signal goes to its active state (low) the output RINTp of NR1 goes high. The signal cycle described above is illustrated in FIG. 4A.

Figure 4A:
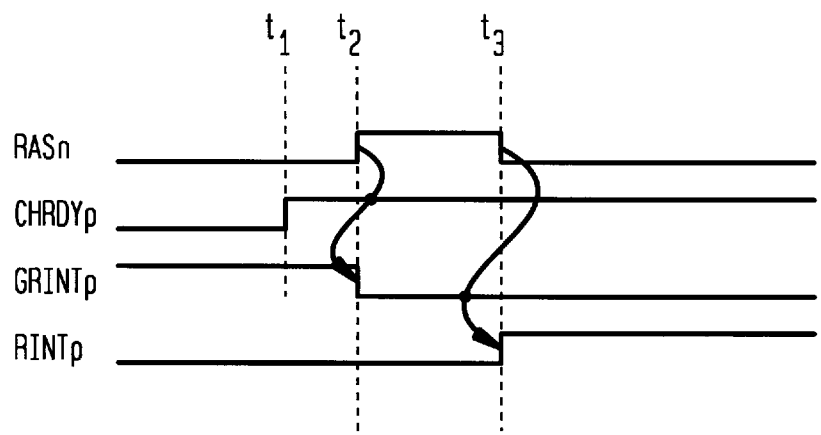
FIGS. 4a–b are waveform diagrams of control signals produced in accordance with the invention.
Figure 4B:
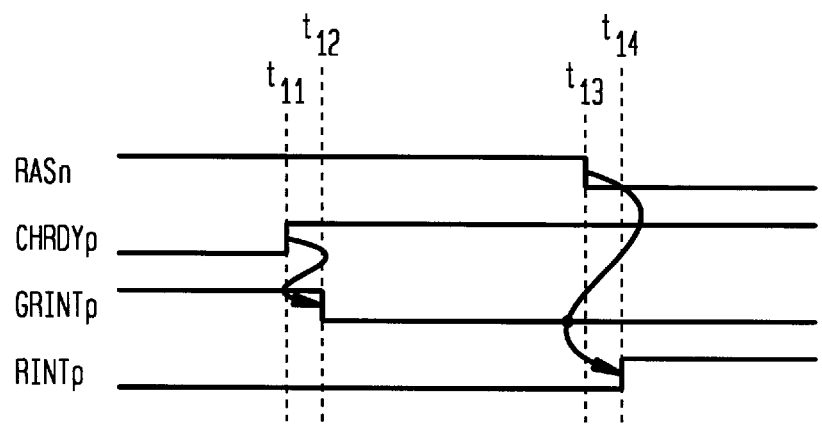

Referring to FIG. 4A, note that, at time t1, if RASn is already active (low) when CHRDYp goes active (power-up), the GRINTp signal will inhibit the production of RINTp from time t1 until t2 when RASn becomes inactive. At time t2, when RASn becomes inactive, RINTp remains inactive. At time t3, RASn goes active low, causing RINTp to be high. By inhibiting the generation of an active RINTp signal until time t3, the memory chip is prevented from entering into test mode unintentionally.

Case 2

When CHRDYp goes active (its high state) during (or upon) power-up and RASn is inactive (its high state) the "high" condition of the CHRDYp signal causes the gating signal GRINTp to go to its inactivate state. As discussed, an active GRINTp signal restricts RINTp from being activated. Thus, when RASn subsequently goes active (low), RINTp is able to switch to its active (high) to initiate the first and all following DRAM cycles.

Referring to FIG. 3, assume that initially The CHRDYp signal is inactive (i.e., low) and that the RASn signal is inactive (i.e., high). For this signal condition, the CHRDYP low signal applied to one input of ND1 causes its output (GRINTp) to go high. The high condition of the GRINTp signal and the RASn high signal are both applied to the inputs of NR1. Either of these high conditions is sufficient to cause the output of NR1 (which defines RINTp) to be low and place RINTp in its inactive state. If RASn is high the output of I1 is low and the output of ND1 is driven high. Hence the outputs of ND1 and ND2 are both high, even though ND1 and ND2 are cross-coupled.

When, subsequently, the CHRDYp signal goes active (i.e., high), while the RAS signal remains inactive (i.e., high), the two inputs to ND2 go high causing the output (GRINTP) of ND2 to go low. This low is fed back to one input of ND1 causing its output to be driven high.

ND1 and ND2 are then cross-coupled with the output of ND2, being low, and the output of ND1, being high. Note also, that when GRINTP goes low, the condition inhibiting RINTp from going high has been removed. Thus, subsequently to the above cycle, when RASn goes active (i.e., low), the two inputs to NR1 go low and the output of NR1 (i.e., RINTp) goes high, which defines an active (high) condition of RINTp. Thus, when RASn goes from a high to a low condition, the output RINTp of NR1 goes high initiating the first and all following DRAM cycles. Thus, it has been shown that by substituting the circuit of FIG. 2 for the circuit 50 in FIG. 1, the problem of operating in an unintended mode is avoided.

To summarize the control circuit, the output of the RS-FF 410 of FIG. 3 is flipped to logic low, inactivating GRINTp. Once GRINTp is inactive, RINTp can go active via NOR gate NOR1 when RASn goes active again. From this point on, RINTp inversely follows RASn transitions.

The invention has been illustrated using a DRAM. However, it should be appreciated that the invention can be used in SRAMs, SDRAMs, as well or any other suitable memory systems. Further, although the invention is illustrated using memory chips, it should be evident that the invention is useful in any suitable circuit where a predetermined sequence of certain signals is desirable upon powering up the circuit. Even further, the control circuit has been described in reference to a specific embodiment. Of course, other implementations of the control circuit can be employed to achieve the desired logic functions. Merely by way of example, a FF implemented with NOR gates can be employed. The scope of the invention should therefore be determined not with reference to the above description but with reference to the appended claims along with their full scope of equivalents.

What is claimed is:

1. A memory chip comprising:
   a control circuit for generating an internal control signal, the control circuit comprises
   a first input terminal receiving a first input signal, the first input signal having active and inactive states, the active state indicating that the memory chip is ready for operation and the inactive state indicating that the memory chip is not ready for operation,
   a second input terminal receiving a second input signal having active and inactive states, the second input signal being an external control signal, the external control signal when in the active state initiates a memory chip operation,
   an output terminal that transmits an output signal having active and inactive states in response to the first and second input signals, the output signal being the internal control signal,
   wherein the control circuit causes the output signal to be in said inactive state when either of the first or second input signals is inactive and the control circuit causes the output signal to be in the active state when the first input signal is active followed by the second input signal becoming active.

* * * * *